(12) United States Patent
Ishimaru et al.

(10) Patent No.: US 8,097,814 B2
(45) Date of Patent: Jan. 17, 2012

(54) PRINTED CIRCUIT BOARD AND METHOD OF MANUFACTURING THE SAME

(75) Inventors: Yasuto Ishimaru, Ibaraki (JP); Hirofumi Ebe, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 227 days.

(21) Appl. No.: 12/356,099

(22) Filed: Jan. 20, 2009

(65) Prior Publication Data

US 2009/0195997 A1 Aug. 6, 2009

(30) Foreign Application Priority Data

Jan. 31, 2008 (JP) ................................. 2008-021272

(51) Int. Cl.
*H05K 1/16* (2006.01)
(52) U.S. Cl. ........ 174/260; 174/250; 174/255; 174/257; 174/258; 174/261; 361/760; 257/666; 257/99; 257/684; 257/707; 438/128
(58) Field of Classification Search .................. 174/260, 174/250, 255, 257, 258, 261; 361/760; 257/666, 257/99, 684, 707; 438/128
See application file for complete search history.

(56) References Cited

U.S. PATENT DOCUMENTS

| | | | | | |
|---|---|---|---|---|---|
| 5,639,385 | A | * | 6/1997 | McCormick | 216/14 |
| 5,717,252 | A | * | 2/1998 | Nakashima et al. | 257/707 |
| 5,763,952 | A | * | 6/1998 | Lynch et al. | 257/735 |
| 5,801,432 | A | * | 9/1998 | Rostoker et al. | 257/666 |
| 5,854,085 | A | * | 12/1998 | Raab et al. | 438/123 |
| 6,013,946 | A | * | 1/2000 | Lee et al. | 257/684 |
| 6,399,899 | B1 | * | 6/2002 | Ohkawa et al. | 174/261 |
| 6,939,745 | B2 | * | 9/2005 | Naito | 438/125 |
| 7,551,452 | B2 | * | 6/2009 | Ishimaru et al. | 361/760 |
| 7,659,605 | B2 | * | 2/2010 | Ishimaru et al. | 257/666 |
| 2004/0224436 | A1 | * | 11/2004 | Naito | 438/106 |
| 2005/0130351 | A1 | * | 6/2005 | Leedy | 438/128 |
| 2005/0260391 | A1 | * | 11/2005 | Nakamura et al. | 428/209 |
| 2005/0284917 | A1 | * | 12/2005 | Clare et al. | 228/170 |
| 2006/0071325 | A1 | | 4/2006 | Tanaka | |
| 2006/0214178 | A1 | * | 9/2006 | Choi et al. | 257/99 |

(Continued)

FOREIGN PATENT DOCUMENTS

CN 1901179 A 1/2007

(Continued)

OTHER PUBLICATIONS

European Search Report for the related European Application No. 09250033.9 dated Apr. 27, 2010.

(Continued)

*Primary Examiner* — Xiaoliang Chen
(74) *Attorney, Agent, or Firm* — Panitch Schwarze Belisario & Nadel LLP

(57) ABSTRACT

A mounting region is provided at an approximately center of one surface of an insulating layer. A conductive trace is formed so as to outwardly extend from inside of the mounting region. A cover insulating layer is formed in the periphery of the mounting region so as to cover the conductive trace. A terminal of the conductive trace is arranged in the mounting region, and a bump of an electronic component is bonded to the terminal. A metal layer made of copper, for example, is provided on the other surface of the insulating layer. A slit is formed in the metal layer so as to cross a region being opposite to the electronic component and to divide the metal layer.

5 Claims, 9 Drawing Sheets

U.S. PATENT DOCUMENTS

| | | |
|---|---|---|
| 2007/0000689 A1* | 1/2007 | Ishimaru et al. ............... 174/255 |
| 2007/0013056 A1* | 1/2007 | Lee et al. ....................... 257/723 |
| 2007/0023876 A1* | 2/2007 | Nakamura et al. ............ 257/666 |
| 2007/0108631 A1* | 5/2007 | Nakamura et al. ............ 257/784 |
| 2007/0170911 A1* | 7/2007 | Ohsawa et al. ............ 324/158.1 |
| 2008/0029293 A1* | 2/2008 | Ooyabu et al. ................. 174/250 |
| 2008/0057604 A1* | 3/2008 | Tanaka ............................ 438/29 |
| 2008/0057605 A1* | 3/2008 | Morisue et al. ................. 438/29 |
| 2008/0315437 A1 | 12/2008 | Lee et al. |
| 2009/0096069 A1* | 4/2009 | Ishimaru et al. ............... 257/666 |
| 2009/0242506 A1 | 10/2009 | Nakamura et al. |
| 2009/0277667 A1 | 11/2009 | Ebe et al. |

FOREIGN PATENT DOCUMENTS

| | | |
|---|---|---|
| CN | 1967831 A | 5/2007 |
| EP | 1786247 A2 | 5/2007 |
| JP | 05152353 A | 6/1993 |
| JP | 2007027682 A | 2/2007 |

OTHER PUBLICATIONS

Office Action dated Jul. 13, 2011 in Chinese Application No. 200910001973.6.

* cited by examiner

F I G. 1
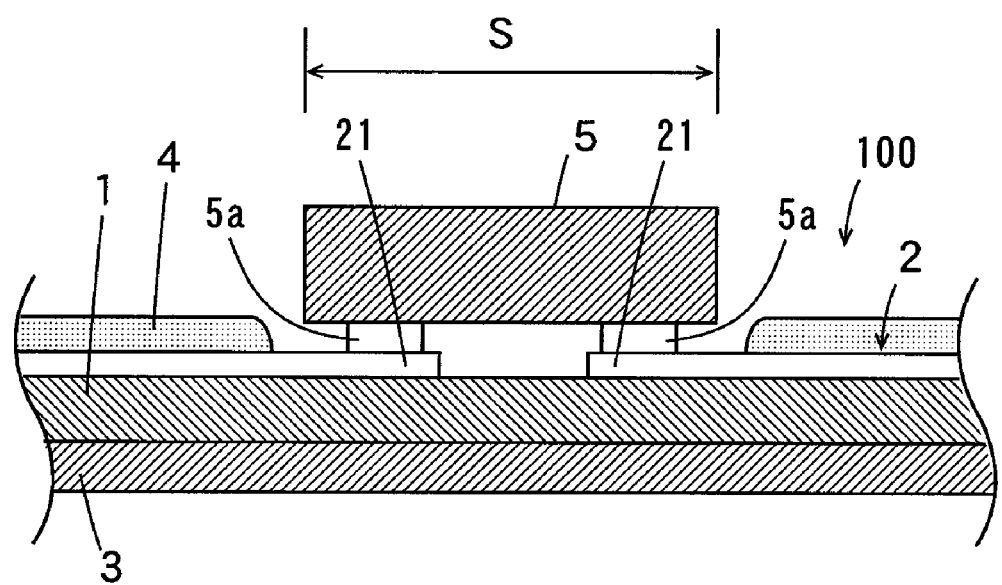

F I G. 3
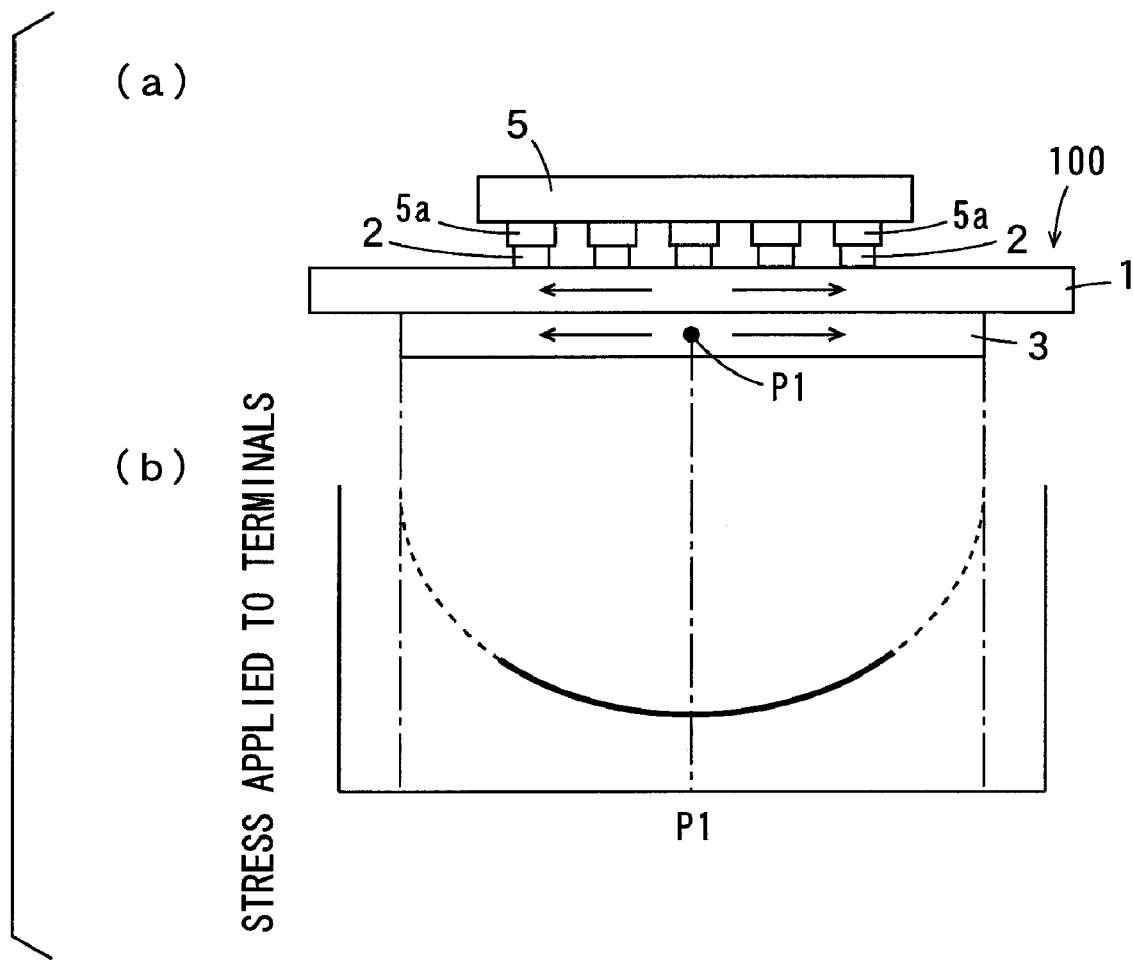

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

Conventionally, a COF (Chip On Film) mounting technique has been known as a technique for mounting electronic components such as an LSI (Large Scale Integration) on a film-like substrate. In general, the substrate for COF (hereinafter referred to as the COF substrate) has a two-layer structure of an insulating layer made of polyimide and a conductive pattern made of copper. Terminals are formed on the conductive pattern. Terminals (bumps) of the electronic components are bonded to the terminals of the conductive pattern.

With a finer pitch of the COF substrate and higher performance of the electronic components, a heating value at the time of driving increases. This causes problems such as a malfunction of the electronic components in some cases; therefore, it is important to carry out sufficient heat dissipation. Thus, it is proposed to provide a metal layer for heat dissipation on a back surface (a surface to which the electronic components are not bonded) of the insulating layer of the COF substrate.

In a tape circuit board disclosed in JP 2007-27682 A, for example, the metal layer is formed, below a chip mounting region, on a lower surface of a base film.

FIG. 9 is a schematic sectional view of a conventional COF substrate provided with the metal layer. In the COF substrate 200 of FIG. 9, conductive traces 32 are provided on one surface of the insulating layer 31 while the metal layer 33 is provided on the other surface. The bumps 35a of the electronic component 35 are bonded to terminals of the conductive traces 32. Such a configuration causes heat of the electronic component 35 to be dissipated through the metal layer 33.

The electronic component 35 is connected to the terminals of the conductive traces 32 by thermocompression bonding, for example. In the case, the insulating layer 31 and the metal layer 33 of the COF substrate 200 are expanded by heat. In addition, the insulating layer 31 and the metal layer 33 are also expanded by heat generated by the electronic component 35 at the time of driving the electronic component 35.

A distance between the bumps 35a of the electronic component 35 are much smaller than the expansion volume of the metal layer 33. Therefore, stresses are applied to the terminals of the conductive traces 32 when the insulating layer 31 and the metal layer 33 are expanded.

Since the insulating layer 33 is flexed in the case of no metal layer 33 provided, the stresses applied to the terminals are relaxed. When the metal layer 33 is provided, however, the insulating layer 31 is unlikely to be flexed, thus not relaxing the stresses applied to the terminals. As a result, the conductive traces 32 are stripped from the insulating layer 31, and the terminals of the conductive traces 32 are separated from the bumps 35a of the electronic component 35 in some cases.

SUMMARY OF THE INVENTION

An object of the present invention is to provide a printed circuit board with sufficient heat dissipation and improved connectivity to an electronic component and a method of manufacturing the same.

(1) According to an aspect of the present invention, a printed circuit board having a mounting region on which an electronic component is to be mounted includes an insulating layer, a conductive trace that is formed on one surface of the insulating layer and to be electrically connected to the electronic component, and a metal layer that is formed on the other surface of the insulating layer and has an opening, wherein the opening is formed in a region, which coincides with the mounting region, of the metal layer.

In this printed circuit board, the electronic component is connected to the conductive trace formed on the one surface of the insulating layer. The heat of the electronic component is dissipated through the metal layer formed on the other surface of the insulating layer. This prevents generation of a malfunction of the electronic component.

The insulating layer and the metal layer are thermally expanded at the time of thermocompression bonding and driving of the electronic component. In the case, the insulating layer expands so as to follow the expansion of the metal layer. Therefore, the opening is formed in the region, which coincides with the mounting region, of the metal layer, so that the stress, which is applied to the conductive trace at the time of thermal expansion of the insulating layer and the metal layer, is relaxed. This improves connectivity between the conductive trace and the electronic component.

(2) The opening may be formed so as to divide the metal layer. In this case, the metal layer expands so as to outwardly extend in each of the divided regions. This causes the stress applied to the conductive trace to be distributed. Accordingly, the stress applied to the conductive trace is sufficiently relaxed to further improve the connectivity between the conductive trace and the electronic component.

(3) The opening may be formed so as to equally divide the metal layer into a plurality of regions. In this case, the stress applied to the conductive trace is more sufficiently relaxed to further improve the connectivity between the conductive trace and the electronic component.

(4) The opening may include a slit having a linear shape. In this case, a sufficient area of the metal layer can be secured. This allows heat dissipation through the metal layer to be sufficiently secured.

(5) The mounting region may have a rectangular shape, and the slit may be formed in parallel with a pair of sides, which are parallel to each other, of the mounting region. In this case, the stress applied to the conductive trace can be effectively relaxed with a simple configuration.

(6) According to another aspect of the present invention, a method of manufacturing a printed circuit board having a mounting region on which an electronic component is to be mounted includes the steps of forming on one surface of an insulating layer a conductive trace that is to be electrically connected to the electronic component, and forming on the other surface of the insulating layer a metal layer having an opening, wherein the opening is formed in a region, which coincides with the mounting region, of the metal layer.

In this method of manufacturing the printed circuit board, the conductive trace is formed on the one surface of the insulating layer, and the metal layer is formed on the other surface of the insulating layer. In this case, heat of the electronic component connected to the conductive trace is dissipated through the metal layer. This prevents generation of a malfunction of the electronic component.

The insulating layer and the metal layer are thermally expanded at the time of thermocompression bonding and driving of the electronic component. In the case, the insulating layer expands so as to follow the expansion of the metal layer. Therefore, the opening is formed in the region, which coincides with the mounting region, of the metal layer, so that the stress, which is applied to the conductive trace at the time of thermal expansion of the insulating layer and the metal layer, is relaxed. This improves connectivity between the conductive trace and the electronic component.

According to the present invention, the heat of the electronic component is dissipated through the metal layer formed on the other surface of the insulating layer. This prevents generation of a malfunction of the electronic component. In addition, the stress, which is applied to the conductive trace at the time of the thermal expansion of the insulating layer and the metal layer, is relaxed. This improves the connectivity between the conductive trace and the electronic component.

Other features, elements, characteristics, and advantages of the present invention will become more apparent from the following description of preferred embodiments of the present invention with reference to the attached drawings.

BRIEF DESCRIPTION OF THE DRAWINGS

FIG. 1 is a sectional view of a COF substrate according to the present embodiment.

FIG. 3 is a diagram showing changes of an insulating layer and a metal layer at the time of thermal expansion.

DESCRIPTION OF THE PREFERRED EMBODIMENTS

Figure 2:
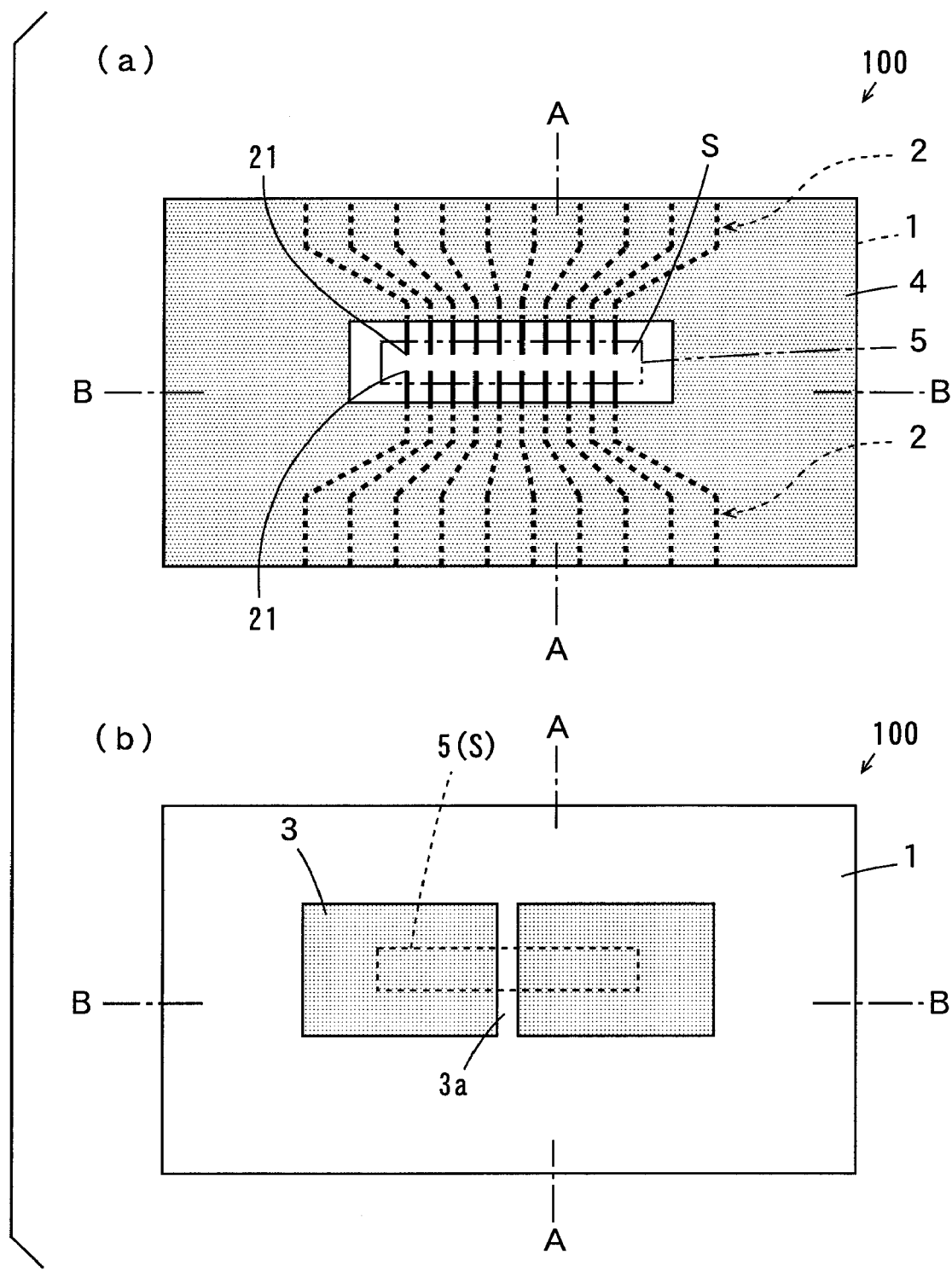
FIG. 2 is a plan view of the COF substrate according to the present embodiment.

Hereinafter, a printed circuit board and a method of manufacturing the same according to one embodiment of the present invention will be described while referring to the drawings. Note that a substrate for COF (Chip On Film) (hereinafter referred to as a COF substrate) is described as one example of the printed circuit board in the present embodiment.

(1) Configuration

FIG. 1 is a sectional view of the COF substrate according to the present embodiment, and FIG. 2 is a plan view of the COF substrate according to the present embodiment. Note that FIG. 2(a) shows an upper surface of the COF substrate of FIG. 1, and FIG. 2(b) shows a lower surface of the COF substrate of FIG. 1. The sectional view taken along the line A-A of FIG. 2(a) and (b) corresponds to the sectional view of FIG. 1.

As shown in FIGS. 1 and 2, the COF substrate 100 includes an insulating layer 1 made of polyimide, for example. A mounting region S is provided at an approximately center of one surface of the insulating layer 1. Conductive traces 2 are formed so as to outwardly extend from inside of the mounting region S. Note that the conductive traces 2 include signal lines for transmitting electrical signals and dummy lines not transmitting electrical signals. A cover insulating layer 4 is formed in a periphery of the mounting region S so as to cover the conductive traces 2. Terminals 21 of the conductive traces 2 are arranged in the mounting region S.

An electronic component 5 (an LSI (Large Scale Integration), for example) is mounted on the COF substrate 100 so as to coincide with the mounting region S. Specifically, bumps 5a (FIG. 1) of the electronic component 5 are bonded to the terminals 21 of the conductive traces 2 by thermocompression bonding, for example. The shape of the mounting region S is set so as to be the same as the shape of the electronic component 5 in planar view. In this example, the electronic component 5 having a rectangular shape is used.

As shown in FIG. 2(b), a metal layer 3 made of copper, for example, is provided on the other surface of the insulating layer 1. A slit 3a is formed in the metal layer 3 so as to cross a region, which is opposite to the electronic component 5, of the metal layer 3 and divide the metal layer 3.

In this COF substrate 100, heat generated in the electronic component 5 is transmitted to the metal layer 3 through the insulating layer 1 to be dissipated. Since the heat does not stay in the electronic component 5 and its periphery, generation of a malfunction of the electronic component 5 is prevented.

Note that the width of the slit 3a is preferably larger than 50 μm and smaller than 500 μm. Moreover, the slit 3a is preferably parallel to shorter sides of the electronic component 5, and formed so as to divide the metal layer 3 into two equal parts.

(2) Expansion of the Insulating Layer and the Metal Layer

At the time of thermocompression bonding or driving of the electronic component 5, heat is added to the insulating layer 1 and the metal layer 3 of the COF substrate 100. This causes the insulating layer 1 and the metal layer 3 to be thermally expanded. In this case, the insulating layer 1 is expanded so as to follow the expansion of the metal layer 3 having high rigidity.

Figure 4:
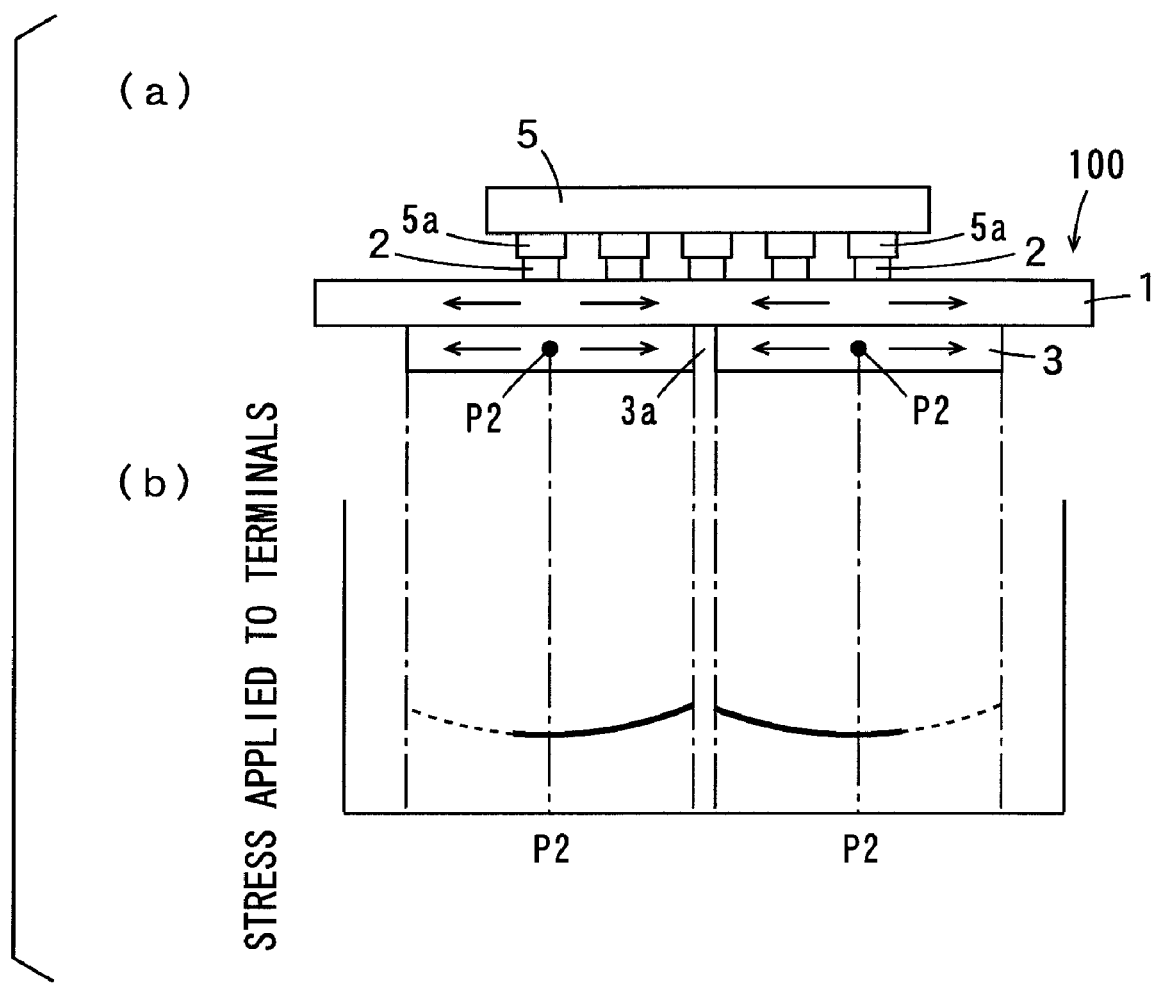
FIG. 4 is a diagram showing changes of the insulating layer and the metal layer at the time of thermal expansion.

FIGS. 3 and 4 are diagrams schematically showing changes of the insulating layer 1 and the metal layer 3 at the time of thermal expansion. FIG. 3(a) and (b) show the changes of the insulating layer 1 and the metal layer 3 when the slit 3a is not formed in the metal layer 3, and FIG. 4(a) and (b) show the changes of the insulating layer 1 and the metal layer 3 when the slit 3a is formed in the metal layer 3.

Note that FIG. 3(a) and FIG. 4(a) show the schematic side views of the COF substrate 100, and FIG. 3(b) and FIG. 4(b) schematically show the stresses applied to the terminals 21 of the conductive traces 2. In FIG. 3(b) and FIG. 4(b), the abscissas indicate the position of the metal layer 3 in the width direction, and the ordinates indicate the stresses applied to the terminals 21 of the conductive traces 2.

As shown in FIG. 3(a), application of heat causes the metal layer 3 to be expanded so as to outwardly extend. With the expansion of the metal layer 3, the insulating layer 1 is expanded so as to outwardly extend. Distances between the bumps 5a of the electronic component 5 are much smaller than the expansion volume of the metal layer 3. Therefore, intervals between the terminals 21 of the conductive traces 2 are maintained much smaller than the expansion volume of the metal layer 3.

Thus, stresses (shear stresses) in a direction parallel to the one surface of the insulating layer 1 are applied to the terminals 21 of the conductive traces 2. Here, since the expansion of the insulating layer 1 follows the expansion of the metal layer 3, the stresses applied to the terminals 21 becomes larger as the distance from the center P1 of the metal layer 3 increases in a region, being opposite to the metal layer 3 of the insulating layer 1, as shown in FIG. 3(b).

When the metal layer 3 is formed so as to cover the region being opposite to the electronic component 5; that is, the slit 3a is not formed in the metal layer 3, significantly large stresses are applied to the terminals 21 positioned far from the center P1 of the metal layer 3.

On the contrary, when the slit 3a is formed so as to divide the metal layer 3, the metal layer 3 is expanded so as to outwardly extend in each of the divided regions of the metal layer 3 as shown in FIG. 4(a). In this case, the stresses applied to the terminals 21 are dependent on the distance from the center P2 in each of the divided regions of the metal layer 3, as shown in FIG. 4(b).

The distances between ends of each of the divided regions of the metal layer 3 and the center P2 are smaller than the distances between ends of the metal layer 3 of FIG. 3(a) and the center P1. This prevents the significantly large stresses from being applied to part of the terminals 21, relaxing the stresses as a whole applied to the terminals 21.

(3) Manufacturing Method

Figure 5:
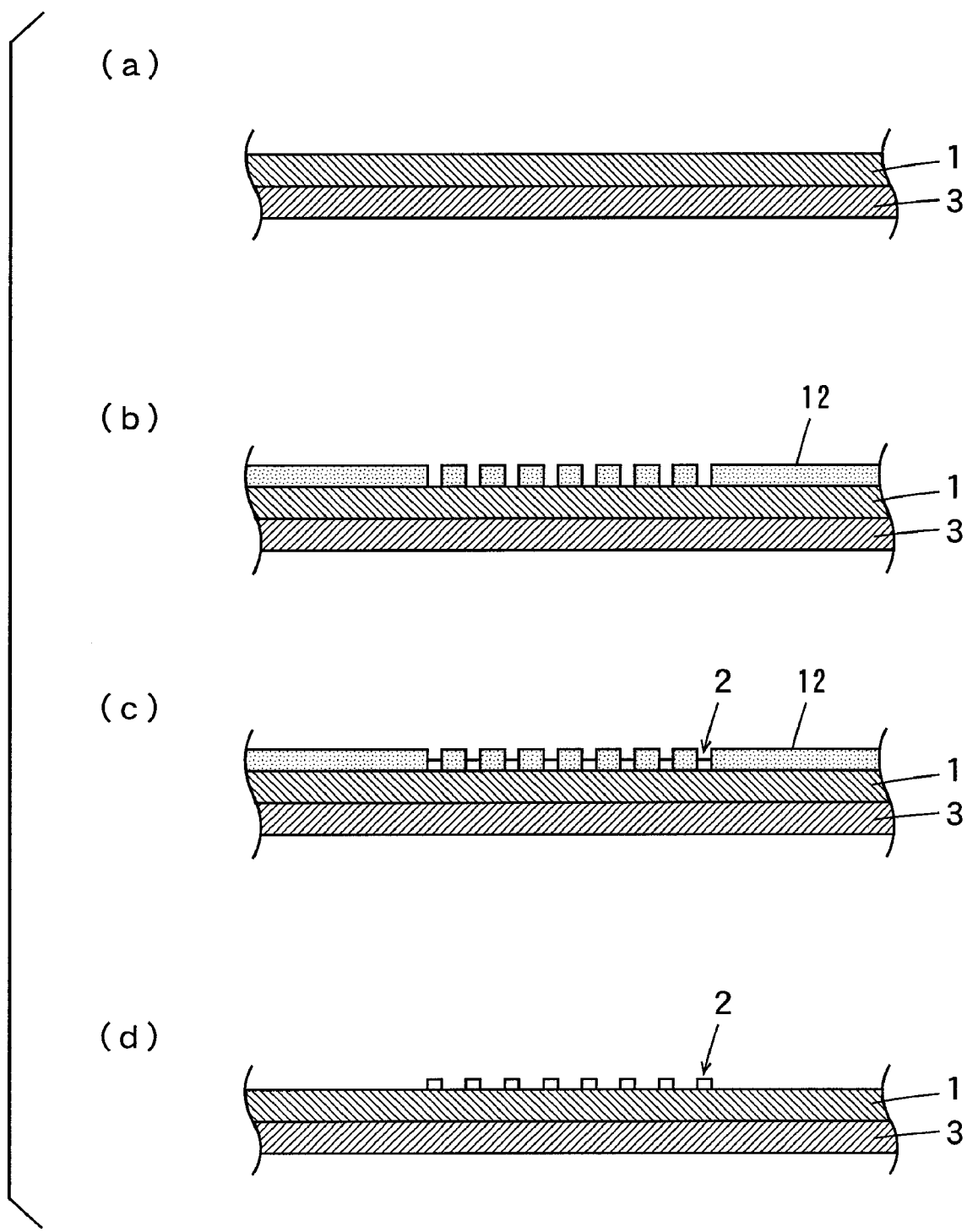
FIG. 5 is a sectional view for explaining steps in a method of manufacturing the COF substrate according to the present embodiment.
Figure 6:
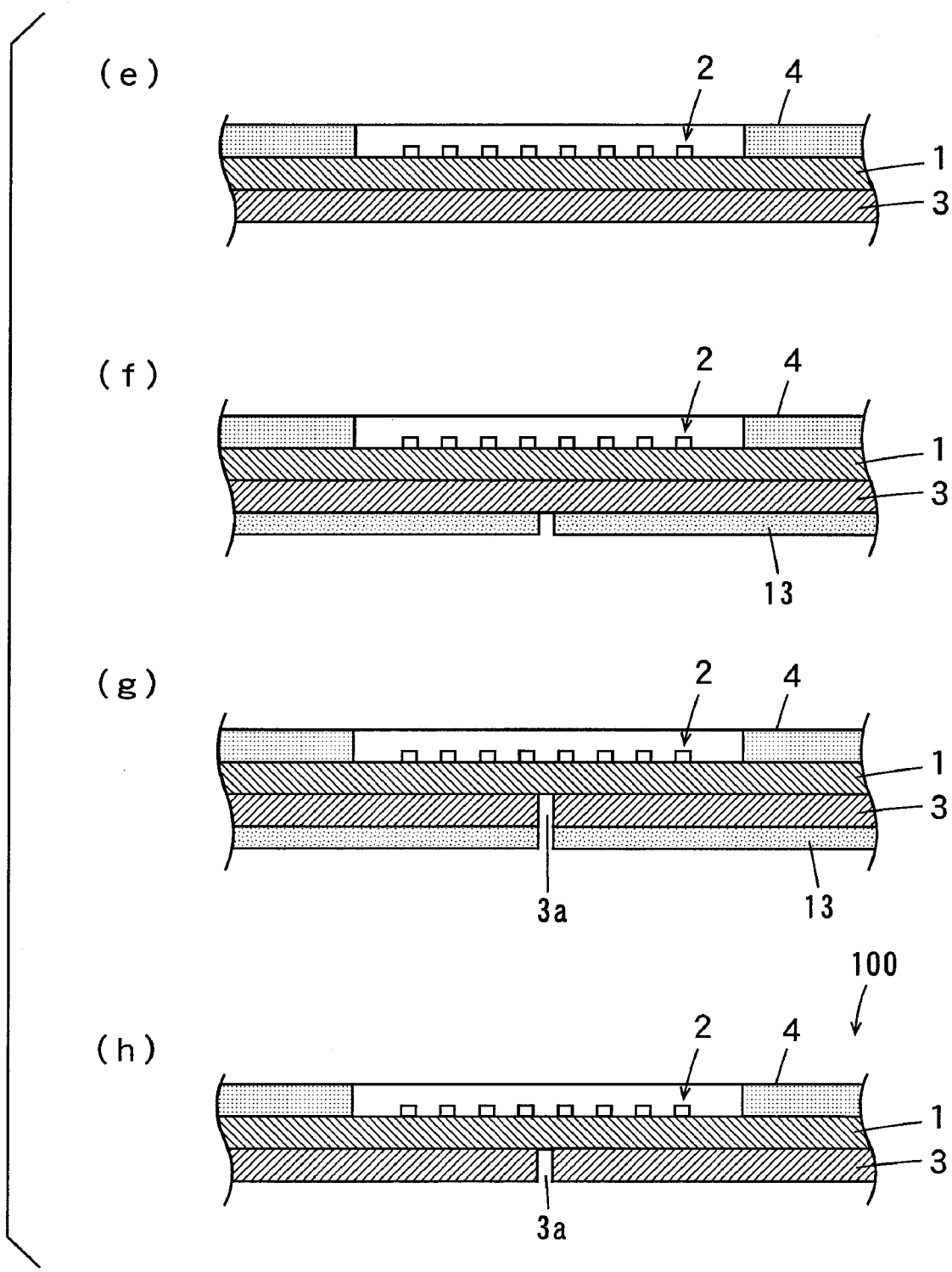
FIG. 6 is a sectional view for explaining steps in the method of manufacturing the COF substrate according to the present embodiment.

Next, description is made of one example of the method of manufacturing the COF substrate 100 according to the present embodiment. FIGS. 5 and 6 are sectional views for explaining steps in the process of manufacturing the COF substrate 100 according to the present embodiment. The cross section shown in FIGS. 5 and 6 corresponds to the cross section taken along the line B-B of FIG. 2.

As shown in FIG. 5(a), a two-layer base material composed of polyimide and copper is prepared. This two-layer base material corresponds to the insulating layer 1 and the metal layer 3 of the COF substrate 100.

First, a thin metal film (not shown) is formed by sputtering on an upper surface of the insulating layer 1. Then, a dry film resist 12 having a reverse pattern of the conductive traces 2 (FIG. 1) is formed on the thin metal film as shown in FIG. 5(b). The reverse pattern is formed by exposure and development of the dry film resist 12.

Then, the conductive traces 2 are formed by electrolytic plating on exposed portions of the insulating layer 1 (exposed portions of the thin metal film) as shown in FIG. 5(c). Then, the dry film resist 12 is removed by a stripping liquid while a region, under the dry film resist 12, of the thin metal film is removed by etching as shown in FIG. 5(d).

Electroless tin plating is subsequently performed on surfaces of the conductive traces 2 as surface treatment for connection with the electronic component 5. Then, the cover insulating layer 4 is formed so as to cover a predetermined region of the conductive traces 2 as shown in FIG. 6(e).

Next, a dry film resist 13 is formed on a lower surface of the metal layer 3 excluding a region in which the slit is to be formed, as shown in FIG. 6(f). Then, the exposed portion of the metal layer 3 is etched to form the slit 3a as shown in FIG. 6(g). After that, the dry film resist 13 is removed by the stripping liquid as shown in FIG. 6(h). In this manner, the COF substrate 100 according to the present embodiment is completed.

While a semi-additive method by which the conductive traces 2 are formed is described as an example, the conductive traces 2 may be formed by a subtractive method.

(4) Effects of the Embodiment

The slit 3a is formed so as to cross the region being opposite to the electronic component 5 to divide the metal layer 2 in the present embodiment. This relaxes the stresses as a whole applied to the terminals 21. As a result, connectivity between the bumps 5a of the electronic component 5 and the terminals 2a of the conductive traces 2 is improved.

(5) Inventive Example and Comparative Example (5-1) Inventive Example

The COF substrate 100 was manufactured under the following condition.

Polyimide was used as a material for the insulating layer 1, and copper was used as a material for the conductive traces 2 and the metal layer 3. The thicknesses of the insulating layer 1 and the metal layer 3 were 35 μm and 15 μm, respectively. The width of each of the terminals 21 of the conductive traces 2 was 8 μm, and the interval between the adjacent terminals 21 was 12 μm. Moreover, the electronic component 5 having shorter sides of 1.6 mm and longer sides of 15 mm in planar view was used.

In addition, the slit 3a that divides the metal layer 3 into two equal parts and extends in parallel with the shorter sides of the electronic component 5 was formed. The width of the slit 3a was set to 100 μm.

(5-2) Comparative Example

The COF substrate 100 was manufactured in the same manner as the foregoing inventive example except that the slit 3a was not formed in the metal layer 3.

(5-3) Evaluation

The electronic component 5 was mounted by thermocompression bonding on each of the COF substrates 100 of the inventive example and the comparative example. Note that at the time of mounting, a tool temperature was 430° C., a stage temperature was 100° C., and a mounting load was 30 N. Here, the tool temperature is a heating temperature of the terminals 21 of the conductive traces 2 or the bumps 5a of the electronic component 5, and the stage temperature is a temperature of a stage on which the COF substrate 100 is placed at the time of mounting of the electronic component 5.

As a result, sufficient heat dissipation was performed through the metal layer 3 while good connection between the terminals 21 of the conductive traces 2 and the bumps 5a of the electronic component 5 was sustained in the COF substrate 100 of the inventive example. Meanwhile, part of the conductive traces 2 was disconnected, and a poor connection occurred between the terminals 21 of the conductive traces 2 and the bumps 5a of the electronic component 5 in the COF substrate 100 of the comparative example.

The results of these show that forming the slit 3a in the metal layer 3 allows the connectivity between the terminals 21 of the conductive traces 2 and the bumps Sa of the electronic component 5 to be improved and sufficient heat dissipation to be secured.

(6) Modifications of the Slit

Figure 7:
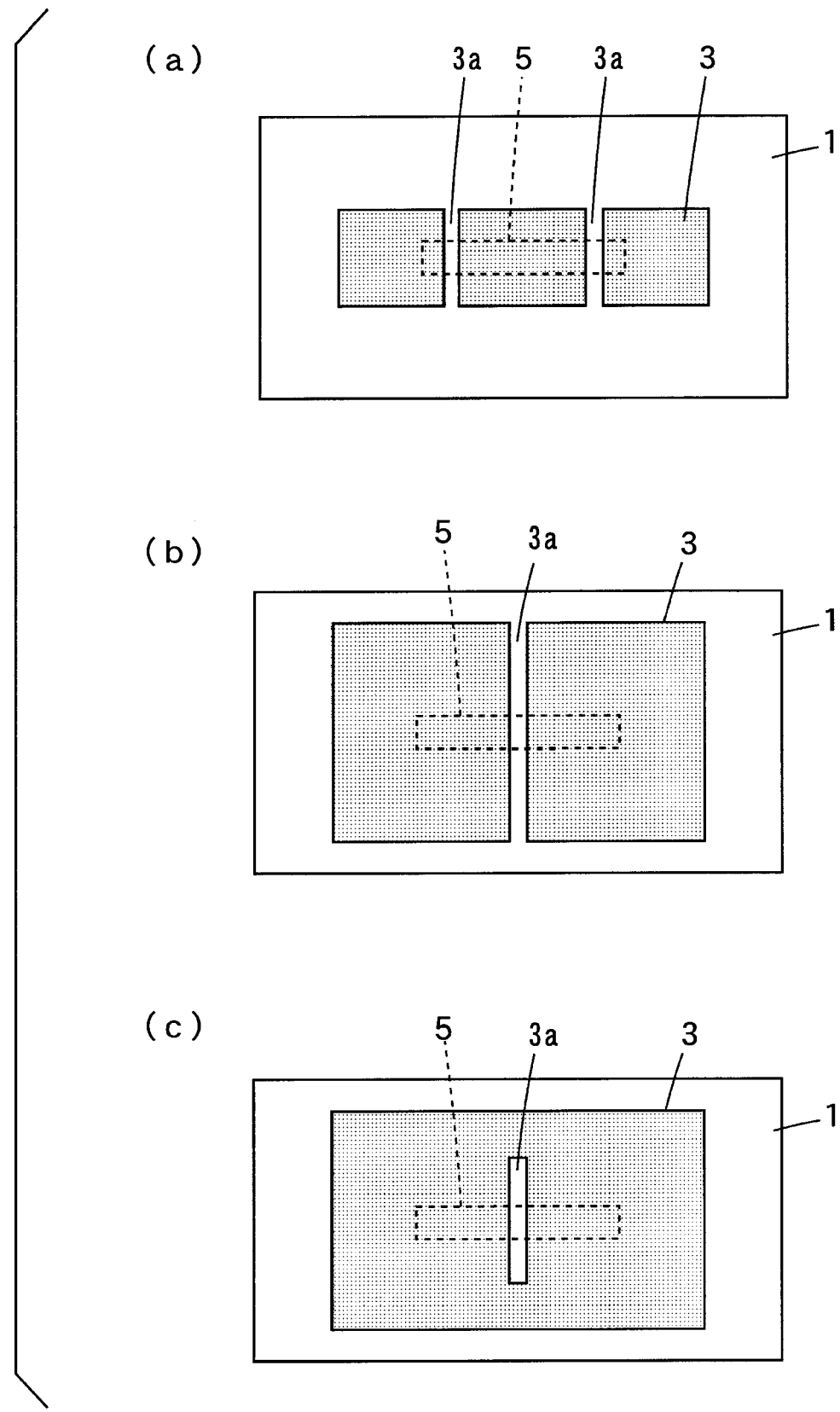
FIG. 7 is a diagram showing modifications of a slit formed in the metal layer.
Figure 8:
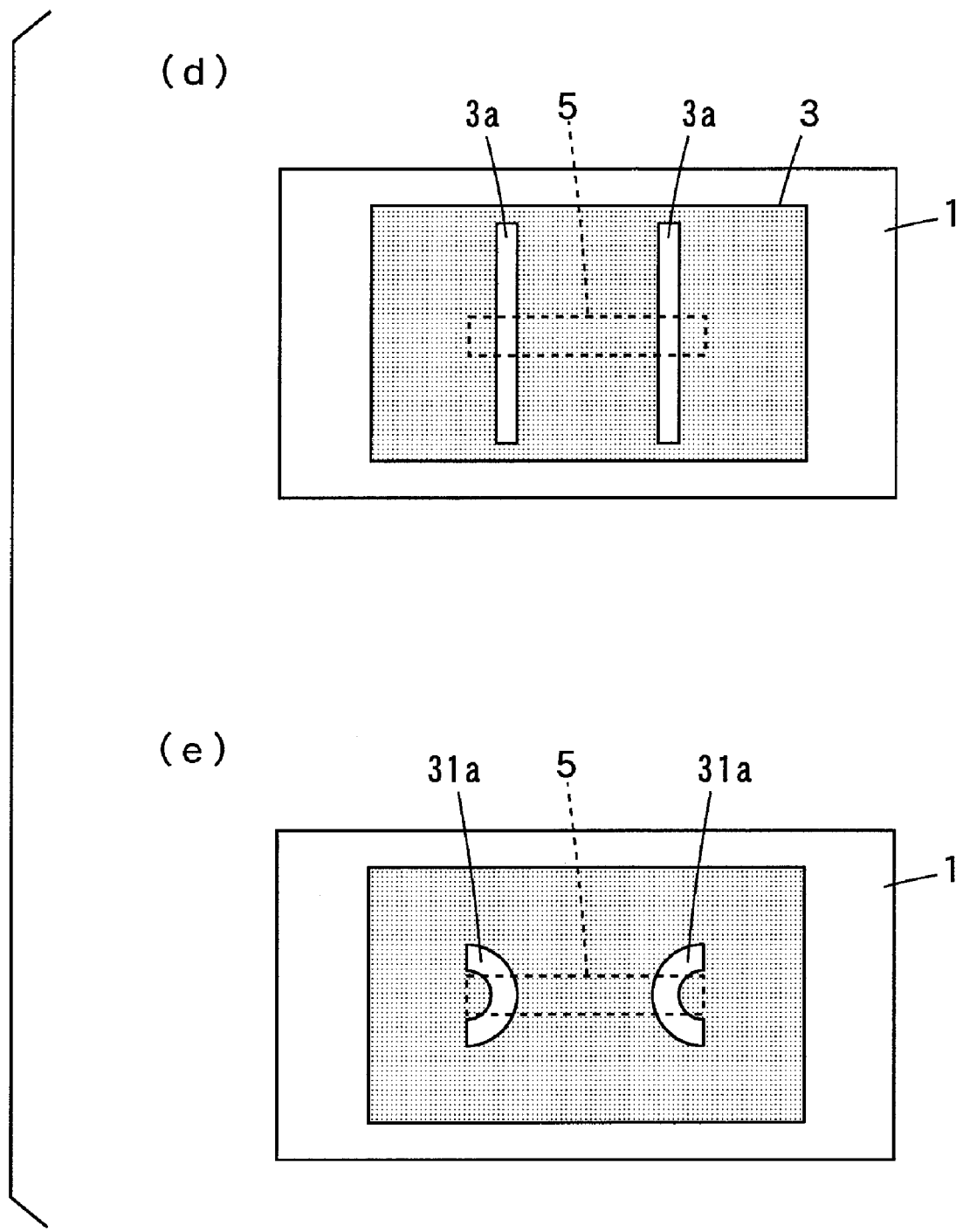
FIG. 8 is a diagram showing modifications of the slit formed in the metal layer.
Figure 9:
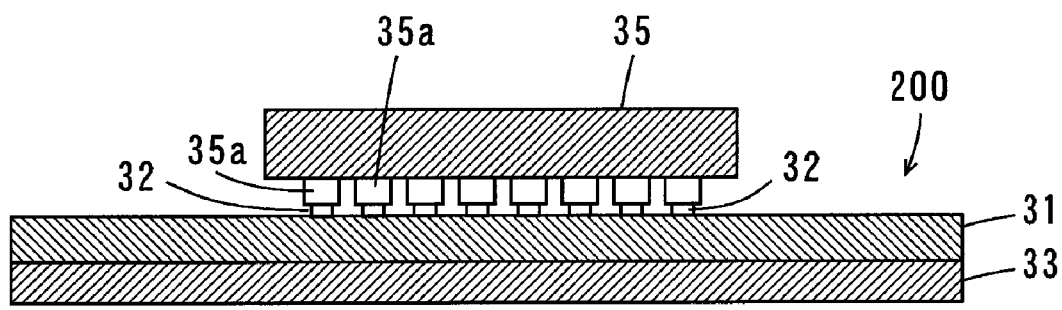
FIG. 9 is a schematic sectional view of a conventional COF substrate including the metal layer.

The arrangement and shape of the slit 3a formed in the metal layer 3 are not limited to the above-described example. FIGS. 7 and 8 are diagrams showing modifications of the slit 3a formed in the metal layer 3.

In the example of FIG. 7(a), two slits 3a are formed so as to divide the metal layer 3 into three substantially equal parts. In this case, the metal layer 3 is expanded in each of three regions. This more sufficiently relaxes the stresses applied to the terminals 21 of the conductive traces 2. Note that it is preferable that the metal layer 3 is equally divided into a plurality of regions when one or plurality of slits 3a are formed so as to divide the metal layer 3. In addition, the number of the slit 3a is preferably from one to five.

In the examples of FIGS. 7(b) to 8(e), the area of the metal layer 3 is set larger than the example shown in FIGS. 1 and 2. This further improves heat dissipation through the metal layer 3.

Moreover, the slit 3a is formed so as not to divide the metal layer 3 in the examples of FIGS. 7(c) to 8(e). In this case, the stresses applied to the terminals 21 of the conductive traces 2 can be relaxed while more sufficiently securing heat dissipation through the metal layer 3.

In the example of FIG. 8(*e*), the slits 3*a* having a shape of a semicircular arc are formed in the metal layer 3. In this manner, the stresses applied to the terminals 21 of the conductive traces 2 can be relaxed while heat dissipation through the metal layer 3 is secured even when the slit does not have a linear shape.

The position, number and shape of the slit are not limited to the foregoing examples, and may be suitably changed according to the shape, size or the like of the electronic component 5. In addition, an opening having another shape such as a round shape or a triangular shape instead of the linear slit may be formed in the metal layer 3.

(7) Correspondences between Elements in the Claims and Parts in Embodiments

In the following paragraph, non-limiting examples of correspondences between various elements recited in the claims below and those described above with respect to various preferred embodiments of the present invention are explained.

In the above-described embodiment, the COF substrate 100 is an example of a printed circuit board, and the slit 3*a*, 31*a* are examples of an opening.

As each of various elements recited in the claims, various other elements having configurations or functions described in the claims can be also used.

(8) Other Embodiments

The material for the insulating layer 1 is not limited to polyimide. For example, another insulating material such as polyethylene terephthalate, polyethernitrile, polyethersulfone may be used. Moreover, the material for the conductive traces 2 is not limited to copper. For example, another metal material such as copper alloy, gold, aluminum may be used.

The material for the metal layer 3 is not limited to copper. Metal having high thermal conductivity such as copper, gold, silver or aluminum is preferably used.

The present invention is applicable to various printed circuit boards such as a flexible printed circuit board and a rigid printed circuit board. Moreover, the electronic component 5 is not limited to an LSI. For example, another electronic component such as a capacitor may be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board having a mounting region on which an electronic component is to be mounted, comprising:
    an insulating layer;
    a plurality of conductive traces formed on a first major surface of said insulating layer for transmitting electrical signals, each of the plurality of conductive traces having a terminal in said mounting region, which are electrically connected to said electronic component; and
    a metal layer that is formed on an oppositely facing major surface of said insulating layer to substantially cover a region opposite said mounting region, wherein
    said metal layer includes an unobstructed slit having a linear shape that divides the metal layer at a location that coincides with said mounting region.

2. The printed circuit board according to claim 1, wherein said slit is formed so as to divide said metal layer.

3. The printed circuit board according to claim 2, wherein said slit is formed so as to equally divide said metal layer into a plurality of regions.

4. The printed circuit board according to claim 1, wherein said mounting region has a rectangular shape, and said slit is formed in parallel with a pair of sides, which are parallel to each other, of said mounting region.

5. A method of manufacturing a printed circuit board having a mounting region on which an electronic component is to be mounted, comprising the steps of:
    forming on a first major surface of an insulating layer a plurality of conductive traces for transmitting electrical signals, each having a terminal in said mounting region, which are to be electrically connected to said electronic component; and
    forming on an oppositely facing major surface of said insulating layer a metal layer that substantially covers a region opposite said mounting region and includes an unobstructed slit having a linear shape that divides the metal layer at a location that coincides with said mounting region.

* * * * *